(12) United States Patent
Yu et al.

(10) Patent No.: US 12,581,932 B2
(45) Date of Patent: Mar. 17, 2026

(54) INTEGRATED CIRCUIT DEVICE AND SEMICONDUCTOR PACKAGE INCLUDING THE SAME

(71) Applicant: Samsung Electronics Co., Ltd., Suwon-si (KR)

(72) Inventors: Bongwee Yu, Suwon-si (KR); Junho Huh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 288 days.

(21) Appl. No.: 18/456,865

(22) Filed: Aug. 28, 2023

(65) Prior Publication Data

US 2024/0136255 A1 Apr. 25, 2024
US 2024/0234254 A9 Jul. 11, 2024

(30) Foreign Application Priority Data

Oct. 24, 2022 (KR) ........................ 10-2022-0137412

(51) Int. Cl.
 *H01L 23/48* (2006.01)
 *H01L 23/00* (2006.01)
 *H01L 23/498* (2006.01)
 *H01L 25/065* (2023.01)

(52) U.S. Cl.
 CPC ...... *H01L 23/481* (2013.01); *H01L 23/49827* (2013.01); *H01L 23/49838* (2013.01); *H01L 24/16* (2013.01); *H01L 25/0657* (2013.01); *H01L 2224/16225* (2013.01); *H01L 2225/06541* (2013.01); *H01L 2924/381* (2013.01)

(58) Field of Classification Search
 CPC ............. H01L 23/481; H01L 23/49816; H01L 23/49827; H01L 23/49838; H01L 23/50; H01L 23/5383; H01L 23/5384; H01L 23/5385; H01L 23/5386; H01L 24/13; H01L 24/14; H01L 24/16; H01L 24/17; H01L 25/0652; H01L 25/0657; H01L 25/105; H01L 2225/06513; H01L 2225/06517; H01L 2225/06541; H01L 2225/1041; H01L 2924/381
 See application file for complete search history.

(56) References Cited

U.S. PATENT DOCUMENTS

| | | | |
|---|---|---|---|
| 7,956,442 B2 | 6/2011 | Hsu et al. |
| 8,836,149 B2 | 9/2014 | Son et al. |
| 9,368,481 B2 | 6/2016 | Choi |
| 11,222,853 B2 | 1/2022 | Kang et al. |
| 2018/0108540 A1 | 4/2018 | Phee et al. |

(Continued)

*Primary Examiner* — Cheung Lee
(74) *Attorney, Agent, or Firm* — Harness, Dickey & Pierce, P.L.C.

(57) ABSTRACT

An integrated circuit device including a first semiconductor chip, a plurality of signal through silicon vias (TSV), a second semiconductor chip, a plurality of signal bumps and an interposer may be provided. The signal TSVs may be in the first semiconductor chip by a first pitch. The second semiconductor chip may be on the first semiconductor chip. The signal bumps may be on a lower surface of the second semiconductor chip by a second pitch wider than the first pitch. The interposer may be interposed between the first semiconductor chip and the second semiconductor chip and may be electrically connecting the signal TSVs with the signal bumps. Thus, an occupying area of the signal TSVs in the first semiconductor chip may be decreased so that the integrated circuit device may have a smaller size.

20 Claims, 11 Drawing Sheets

(56) References Cited

U.S. PATENT DOCUMENTS

2021/0407890  A1    12/2021  Jo et al.
2022/0028834  A1     1/2022  Lee et al.
2022/0084968  A1     3/2022  Son et al.

INTEGRATED CIRCUIT DEVICE AND SEMICONDUCTOR PACKAGE INCLUDING THE SAME

CROSS-RELATED APPLICATION

This application claims priority under 35 USC § 119 to Korean Patent Application No. 10-2022-0137412, filed on Oct. 24, 2022 in the Korean Intellectual Property Office (KIPO), the contents of which are herein incorporated by reference in their entirety.

BACKGROUND

1. Field

Example embodiments relate to integrated circuit devices and/or semiconductor packages including the same. More particularly, example embodiments relate to three-dimensional integrated circuit devices including first and second semiconductor chips and/or semiconductor packages including the three-dimensional integrated circuit device.

2. Description of the Related Art

Generally, a three-dimensional (3D) integrated circuit device may include a first semiconductor chip, a second semiconductor chip, a plurality of signal TSVs, a plurality of signal bumps and an interposer. The second semiconductor chip may be arranged over the first semiconductor chip. The signal TSVs may be arranged in the first semiconductor chip. The signal bumps may be arranged on a lower surface of the second semiconductor chip. The interposer may be interposed between the first semiconductor chip and the second semiconductor chip to electrically connect the signal TSVs with the signal bumps.

According to related arts, a pitch between the signal TSVs may be substantially the same as a pitch between the signal bumps. Thus, an occupying area of the signal TSVs in the first semiconductor chip may be increased, thereby increasing a size of the 3D integrated circuit device. Particularly, regions between the signal TSVs may not be used, and the non-used regions between the signal TSVs may result in increasing the size of the 3D integrated circuit device.

SUMMARY

Some example embodiments provide integrated circuit devices having a small size.

Some example embodiments provide semiconductor packages including the above-mentioned integrated circuit device.

According to an example embodiment, an integrated circuit device may include a first semiconductor chip, a plurality of signal through silicon vias (TSV), a second semiconductor chip, a plurality of signal bumps and an interposer. The signal TSVs may be in the first semiconductor chip by a first pitch. The second semiconductor chip may be on the first semiconductor chip. The signal bumps may be on a lower surface of the second semiconductor chip by a second pitch wider than the first pitch. The interposer may be interposed between the first semiconductor chip and the second semiconductor chip and electrically connecting the signal TSVs with the signal bumps.

According to an example embodiment, a semiconductor package may include a package substrate, a first semiconductor chip, a plurality of signal through silicon vias (TSVs), a second semiconductor chip, a plurality of signal bumps, an interposer and a plurality of external terminals. The first semiconductor chip may be on an upper surface of the package substrate. The first semiconductor chip may be on the package substrate and electrically connected with the package substrate. The signal TSVs may be in the first semiconductor chip by a first pitch. The second semiconductor chip may be on the first semiconductor chip. The signal bumps may be on a lower surface of the second semiconductor chip by a second pitch wider than the first pitch. The interposer may be interposed between the first semiconductor chip and the second semiconductor chip and electrically connecting the signal TSVs with the signal bumps. The external terminals may be on a lower surface of the package substrate.

According to some example embodiments, the first pitch between the signal TSVs in the first semiconductor chip may be narrower than the second pitch between the signal bumps to decrease an occupying area of the signal TSVs in the first semiconductor chip. The narrow first pitch between the signal TSVs may provide a region between the signal TSVs with a smaller area. Thus, the integrated circuit device may have a smaller size.

BRIEF DESCRIPTION OF THE DRAWINGS

Example embodiments will be more clearly understood from the following detailed description taken in conjunction with the accompanying drawings.

FIG. 1 is a cross-sectional view illustrating an integrated circuit device in accordance with an example embodiment;

FIG. 2 is an enlarged cross-sectional view of a portion "A" in FIG. 1;

FIG. 3 is a plan view illustrating signal TSVs of the integrated circuit device in FIG. 1;

FIG. 4 is an enlarged plan view of a portion "B" in FIG. 3;

FIG. 5 is a cross-sectional view illustrating an integrated circuit device in accordance with an example embodiment;

FIG. 6 is an enlarged cross-sectional view of a portion "C" in FIG. 5;

FIG. 7 is a cross-sectional view illustrating an integrated circuit device in accordance with an example embodiment;

FIG. 8 is an enlarged cross-sectional view of a portion "D" in FIG. 7;

FIG. 9 is a cross-sectional view illustrating a semiconductor package including the integrated circuit device in FIG. 1;

FIG. 10 is a cross-sectional view illustrating a semiconductor package including the integrated circuit device in FIG. 5; and FIG. 11 is a cross-sectional view illustrating a semiconductor package including the integrated circuit device in FIG. 7.

DETAILED DESCRIPTION

Hereinafter, some example embodiments will be explained in detail with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
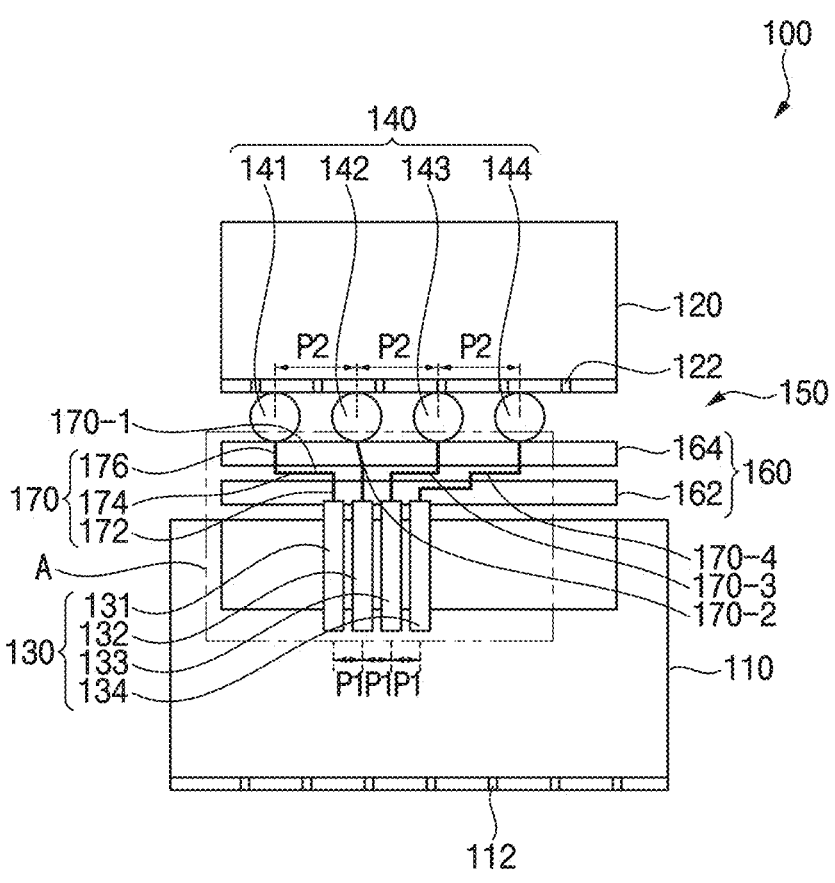
FIGS. 1 to 11 represent non-limiting, example embodiments as described herein.
Figure 2:
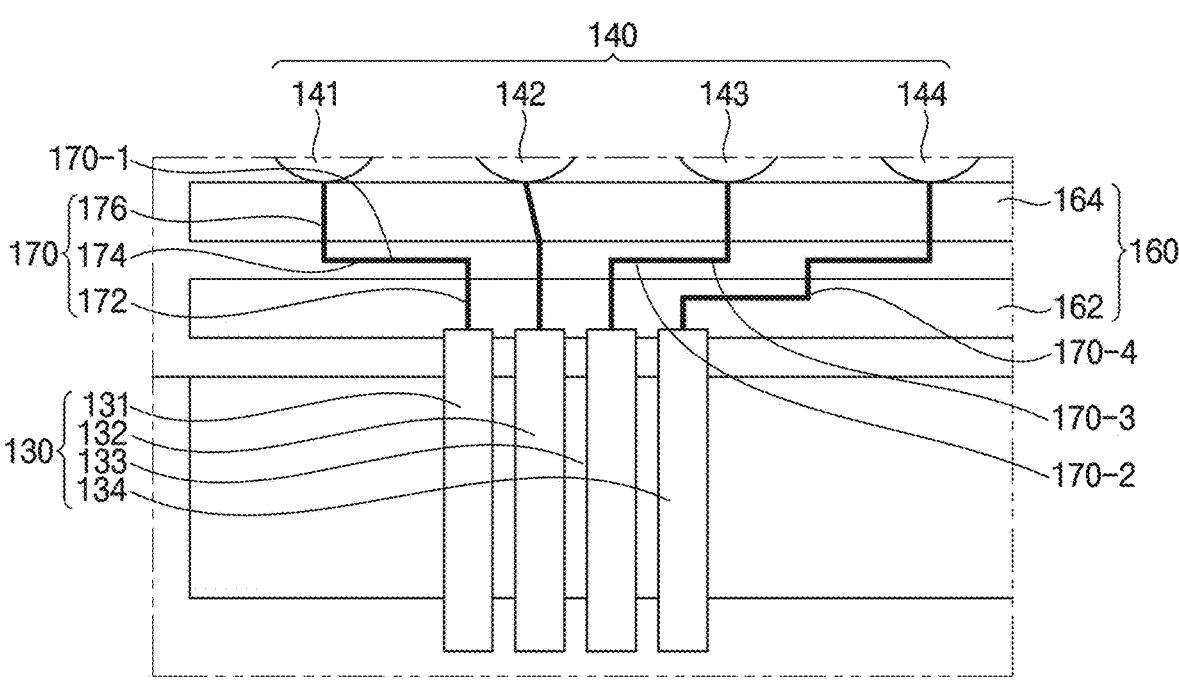

FIG. 1 is a cross-sectional view illustrating an integrated circuit device in accordance with an example embodiment and FIG. 2 is an enlarged cross-sectional view of a portion "A" in FIG. 1.

Referring to FIGS. 1 and 2, an integrated circuit device 100 of an example embodiment may have a three-dimensional (3D) structure. The 3D integrated circuit device 100 may include a first semiconductor chip 110, a plurality of signal TSVs 130, a second semiconductor chip 120, a plurality of signal bumps 140 and an interposer 150.

The first semiconductor chip 110 may include a plurality of first pads 112. The first pads 112 may be arranged on a lower surface of the first semiconductor chip 110. Thus, the lower surface of the first semiconductor chip 110 may correspond to an active face of the first semiconductor chip 110.

The signal TSVs 130 may be arranged in the first semiconductor chip 110. The signal TSVs 130 may be downwardly extended from an upper surface of the first semiconductor chip 110. The signal TSVs 130 may be downwardly extended in a direction substantially perpendicular to the upper surface of the first semiconductor chip 110. The signal TSVs 130 may be spaced apart from each other by a first pitch P1.

The signal TSVs 130 may include a first signal TSV 131, a second signal TSV 132, a third signal TSV 133 and a fourth signal TSV 134. However, example embodiments are not limited thereto. A gap between the first signal TSV 131 and the second signal TSV 132 may correspond to the first pitch P1. A gap between the second signal TSV 132 and the third signal TSV 133 may correspond to the first pitch P1. A gap between the third signal TSV 133 and the fourth signal TSV 134 may correspond to the first pitch P1.

The second semiconductor chip 120 may be arranged on or over the first semiconductor chip 110. The second semiconductor chip 120 may include a plurality of second pads 122. The second pads 122 may be arranged on a lower surface of the second semiconductor chip 120. Thus, the lower surface of the second semiconductor chip 120 may correspond to an active face of the second semiconductor chip 120. In some example embodiments, the second semiconductor chip 120 may have a size smaller than a size of the first semiconductor chip 110. However, example embodiments are not limited thereto. For example, a width of the second semiconductor chip 120 may be narrower than a width of the first semiconductor chip 110.

The signal bumps 140 may be arranged on the lower surface of the second semiconductor chip 120. Each of the signal bumps 140 may make contact with a corresponding one of the second pads 122. The signal bumps 140 may be spaced apart from each other by a second pitch P2. That is, a gap between the second pads 122 may also correspond to the second pitch P2. In some example embodiments, the signal bumps 140 may include micro bumps.

In some example embodiments, because the signal TSVs 130 may include the first to fourth signal TSVs 131, 132, 133 and 134, the signal bumps 140 may also include first to fourth signal bumps 141, 142, 143 and 144. For example, a gap between the first signal bump 141 and the second signal bump 142 may correspond to the second pitch P2. A gap between the second signal bump 142 and the third signal bump 143 may correspond to the second pitch P2. A gap between the third signal bump 143 and the fourth signal bump 144 may correspond to the second pitch P2.

The second pitch P2 may be wider than the first pitch P1. That is, the gap between the signal TSVs 130 may be narrower than the gap between the signal bumps 140. The first pitch P1 may be about 40% to about 60% of the second pitch P2. However, example embodiments are not limited thereto. Thus, because the first pitch P1 may be narrower than the second pitch P2, an occupying area of the signal TSVs 130 in the first semiconductor chip 110 may be decreased.

The interposer 150 may be interposed between the first semiconductor chip 110 and the second semiconductor chip 120. For example, the interposer 150 may be interposed between the upper surface of the first semiconductor chip 110 and the signal bumps 140 to electrically connect the signal TSVs 130 with the signal bumps 140. In the 3D integrated circuit device 100, a structure configured to electrically connect the signal TSVs 130 with the signal bumps 140 having a same pitch may be referred to as a backside metal structure.

However, as mentioned above, because the first pitch P1 between the signal TSVs 130 may be narrower than the second pitch P2 between the signal bumps 140, a structure configured to electrically connect the signal TSVs 130 with the signal bumps 140 having the different pitches may also be referred to as the interposer 150.

The interposer 150 may include at least one insulation layer 160 and a plurality of signal patterns 170. The insulation layer 160 may include a first insulation layer 162 and a second insulation layer 164. However, example embodiments are not limited thereto. The first insulation layer 162 may be arranged on the upper surface of the first semiconductor chip 110. The second insulation layer 164 may be arranged on an upper surface of the first insulation layer 162.

The signal patterns 170 may be arranged in the first insulation layer 162 and the second insulation layer 164 to electrically connect the signal TSVs 130 with the signal bumps 140. As mentioned above, because the signal TSVs 130 and the signal bumps 140 may be four, the signal patterns 170 may also include first to fourth signal patterns 170-1, 170-2, 170-3 and 170-4.

For example, the first signal pattern 170-1 may be configured to electrically connect the first signal TSV 131 with the first signal bump 141. The second signal pattern 170-2 may be configured to electrically connect the second signal TSV 132 with the second signal bump 142. The third signal pattern 170-3 may be configured to electrically connect the third signal TSV 133 with the third signal bump 143. The fourth signal pattern 170-4 may be configured to electrically connect the fourth signal TSV 134 with the fourth signal bump 144.

As illustrated, the first to fourth signal patterns 170-1, 170-2, 170-3 and 170-4 may have a similar shape. Thus, the shape of the first signal pattern 170-1 may be described in detail as an example. The first signal pattern 170-1 may include a first signal line 172, a second signal line 174 and a third signal line 176.

The first signal line 172 may extend in the first insulation layer 162 along the vertical direction. A lower end of the first signal line 172 may be connected to the first signal TSV 131. The second signal line 174 may extend from an upper end of the first signal line 172 between the first insulation layer 162 and the second insulation layer 164 along a horizontal direction. The third signal line 176 may extend from an upper end of the second signal line 174 in the second insulation layer 164 along the vertical direction. An upper end of the third signal line 176 may be connected to the first signal bump 141. Thus, a gap between the first signal line 172 and the third signal line 176 may correspond to the second pitch P2 (e.g., comparable or substantially similar to the second pitch P2). That is, a length of the second signal line 174 may correspond to the second pitch P2. Further, a gap between the first signal lines 172 may correspond to the first pitch P1 (e.g., may be the same as or substantially similar to the first pitch P1).

Figure 3:
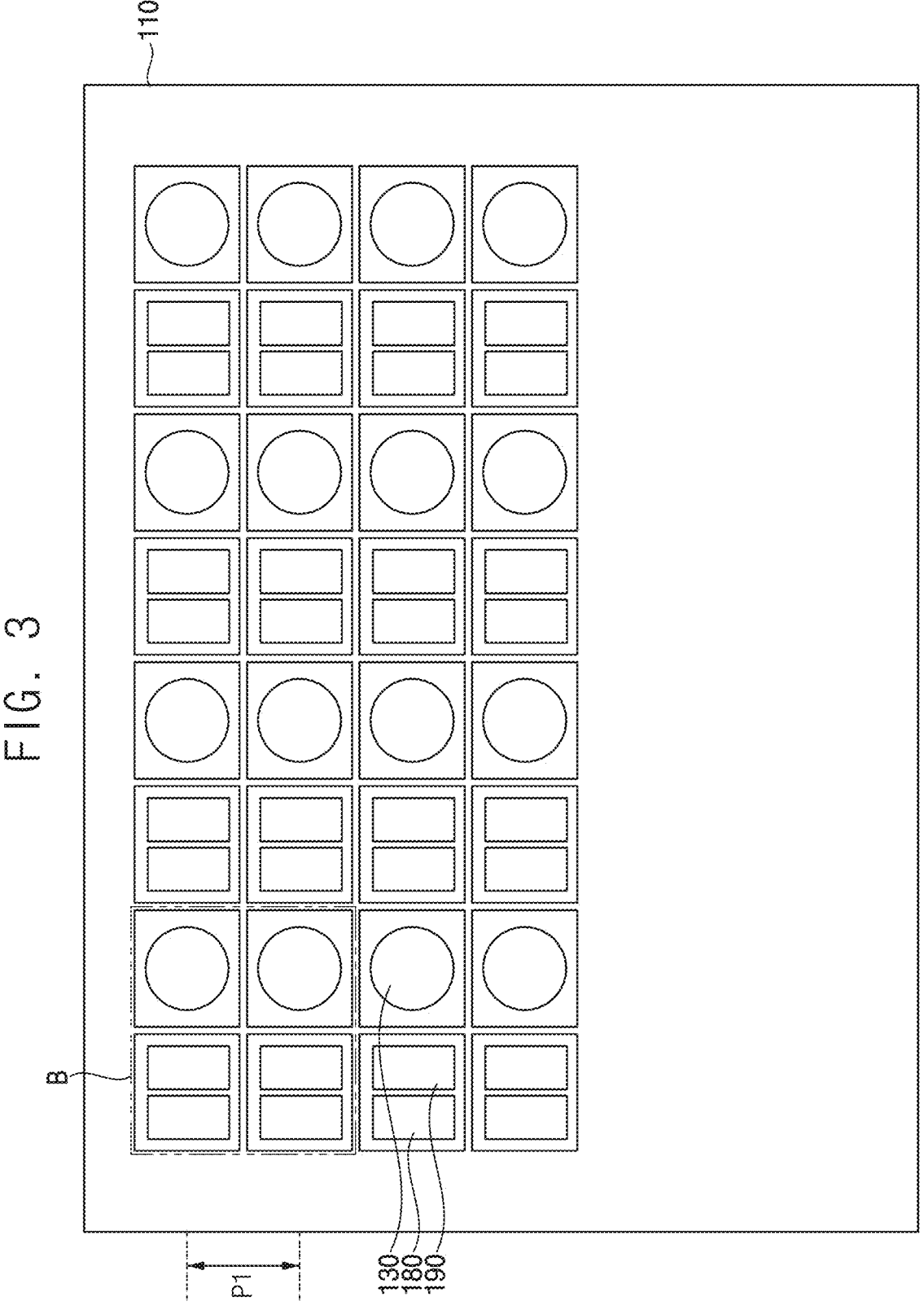
Figure 4:
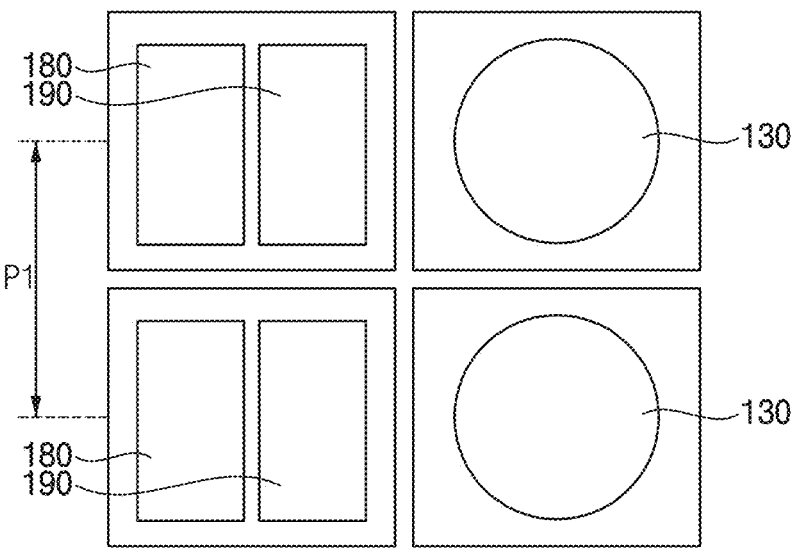

FIG. 3 is a plan view illustrating signal TSVs of the integrated circuit device in FIG. 1 and FIG. 4 is an enlarged plan view of a portion "B" in FIG. 3.

Referring to FIGS. 3 and 4, the signal TSVs 130 may form a group together with driver 180s and electrostatic discharge (ESD) diodes 190. As mentioned above, because the signal TSVs 130 may be spaced apart from each other by the first pitch P1, the drivers 180 and the ESD diodes 190 may also be spaced apart from each other by the first pitch P1. Thus, occupying areas of the drivers 180 and the ESD diodes 190 may be decreased.

Figure 5:
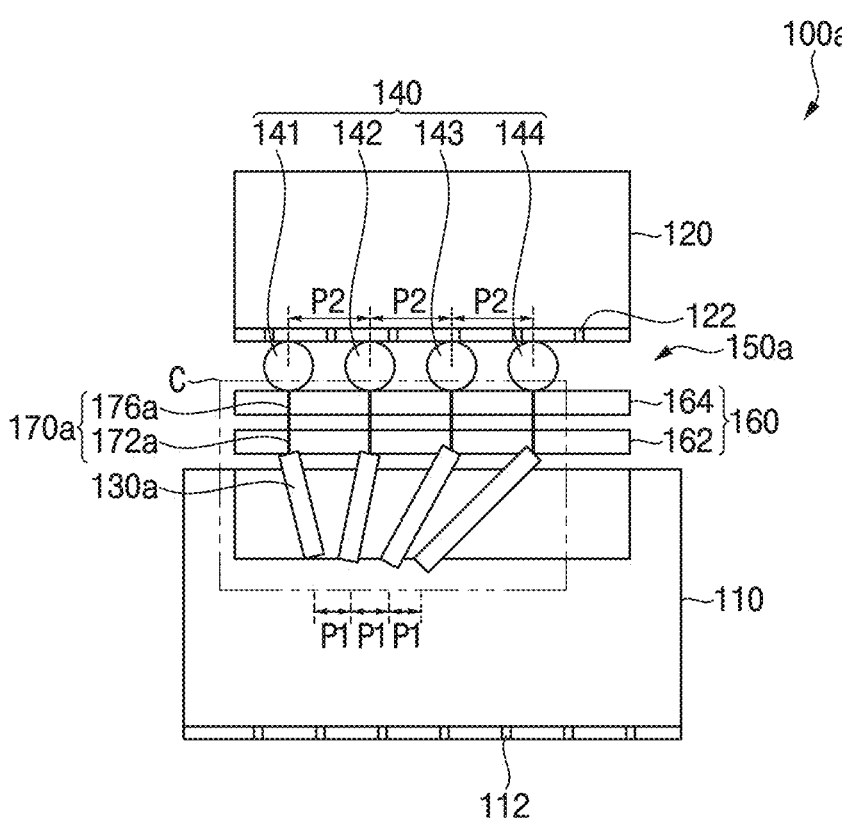
Figure 6:
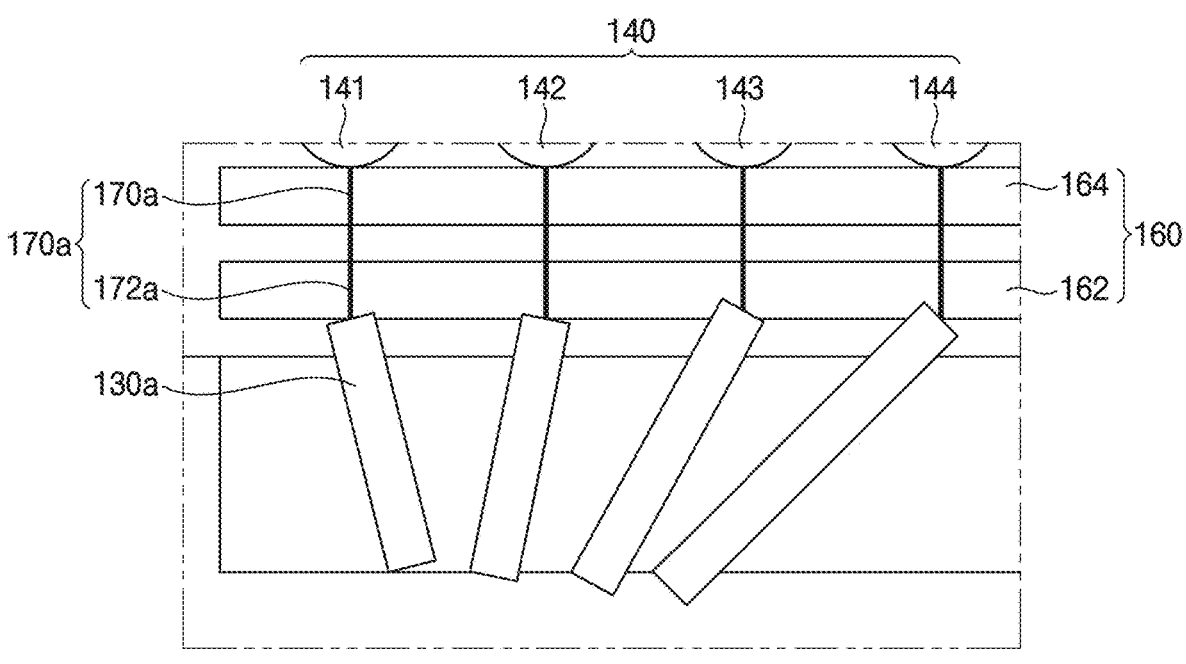

FIG. 5 is a cross-sectional view illustrating an integrated circuit device in accordance with an example embodiment, and FIG. 6 is an enlarged cross-sectional view of a portion "C" in FIG. 5.

An integrated circuit device 100a of example embodiments may include elements substantially the same as those of the integrated circuit device 100 in FIG. 1 except for signal TSVs and signal patterns. Thus, the same reference numerals may refer to the same elements and any further illustrations with respect to the same elements may be omitted herein for brevity.

Referring to FIGS. 5 and 6, signal TSVs 130a may be slantly extended. A gap between the slant signal TSVs 130a may be gradually widened. Thus, the slant signal TSVs 130a may have a first lower pitch and a first upper pitch. Particularly, an upper end of each of the signal TSVs 130a may be positioned on a vertical line passing through the signal bump 140. Thus, the first upper pitch may correspond to the second pitch P2 between the signal bumps 140. In contrast, the first lower pitch may correspond to the first pitch P1 between the signal TSVs 130 of the integrated circuit device 100 in FIG. 1.

Because the upper end of the signal TSV 130a may be positioned on the vertical line passing through the signal bump 140, an interposer 150a of example embodiments may not include the second signal line 174 as the signal pattern 170 in FIG. 1. That is, the interposer 150a may include only a signal pattern 170a vertically extending in the first and second insulation layers 162 and 164.

For example, the signal pattern 170a may include a first signal line 172a and a second signal line 176a. The first signal line 172a may vertically extend in the first insulation layer 162. A lower end of the first signal line 172a may be connected to the upper end of the signal TSV 130. The third signal line 176a may be vertically extend from an upper end of the first signal line 172a in the second insulation layer 164. An upper end of the third signal line 176a may be connected to the signal bump 140.

Figure 7:
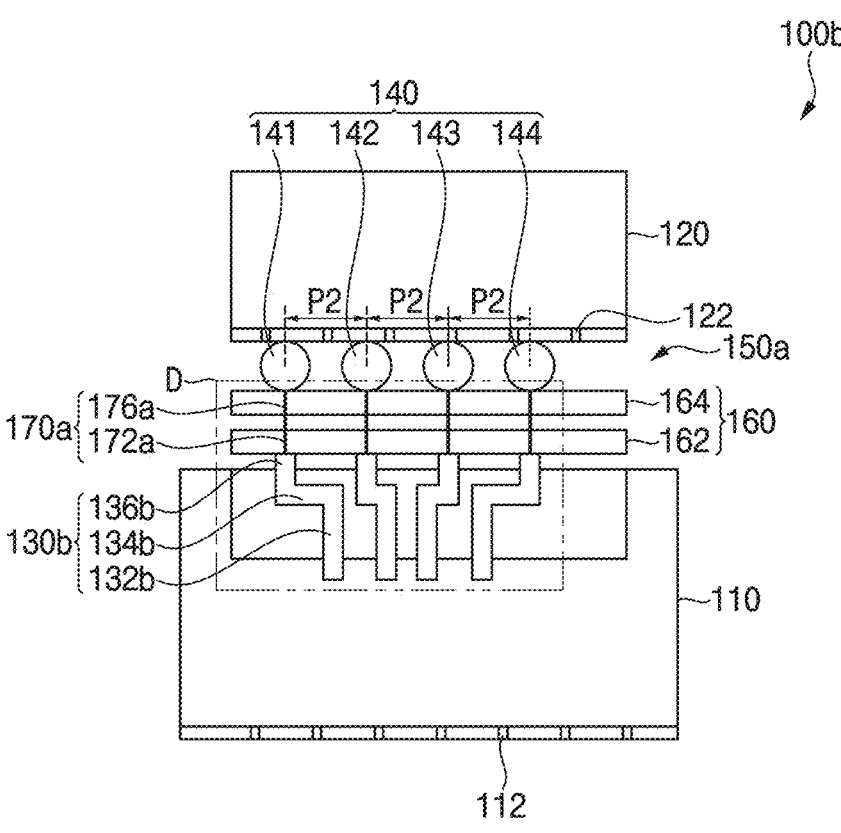
Figure 8:
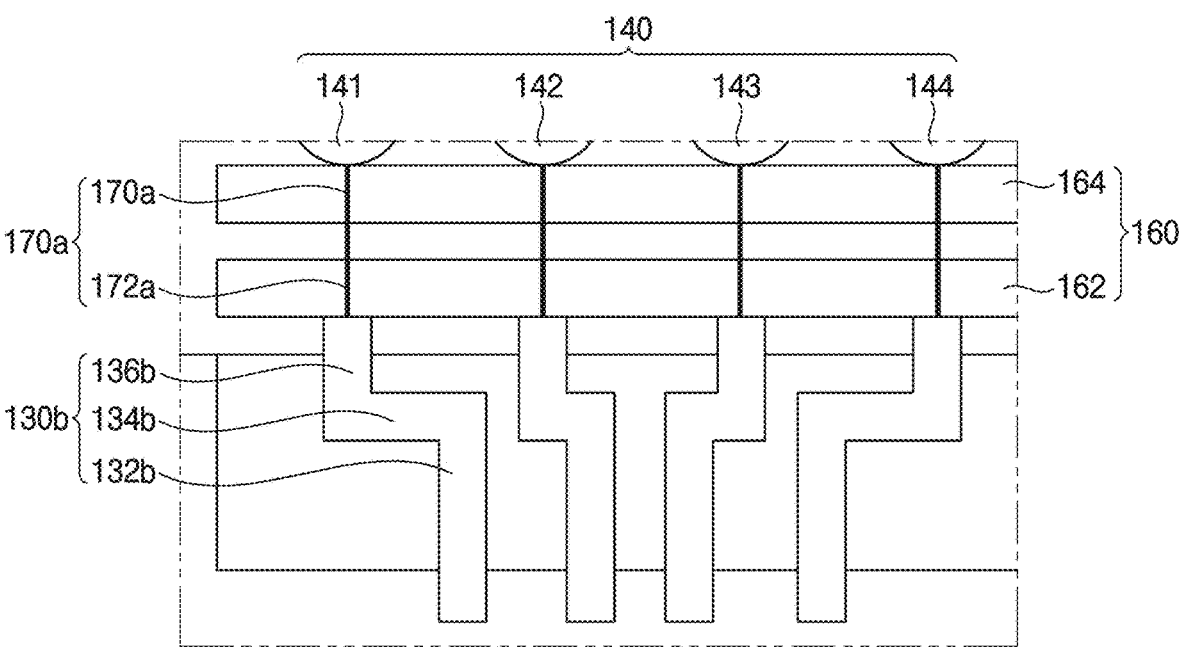

FIG. 7 is a cross-sectional view illustrating an integrated circuit device in accordance with an example embodiment and FIG. 8 is an enlarged cross-sectional view of a portion "D" in FIG. 7.

An integrated circuit device 100b of this example embodiment may include elements substantially the same as those of the integrated circuit device 100a in FIG. 5 except for signal TSVs. Thus, the same reference numerals may refer to the same elements and any further illustrations with respect to the same elements may be omitted herein for brevity.

Referring to FIGS. 7 and 8, each of signal TSVs 130b of example embodiments may have a stepped shape. For example, the signal TSV 130b may include a first via 132b, a horizontal connection 134b and a second via 136b.

The first via 132b may vertically extend in the first semiconductor chip 110. The horizontal connection 134b may horizontally extend from an upper end of the first via 132b. The second via 136b may vertically extend from an end of the horizontal connection 134b. An upper end of the second via 136b may be connected to a lower end of the first signal line 172a of the interposer 150a. Thus, a gap between the first vias 132b may correspond to the first lower pitch. A gap between the second vias 136b may correspond to the first upper pitch.

Figure 9:
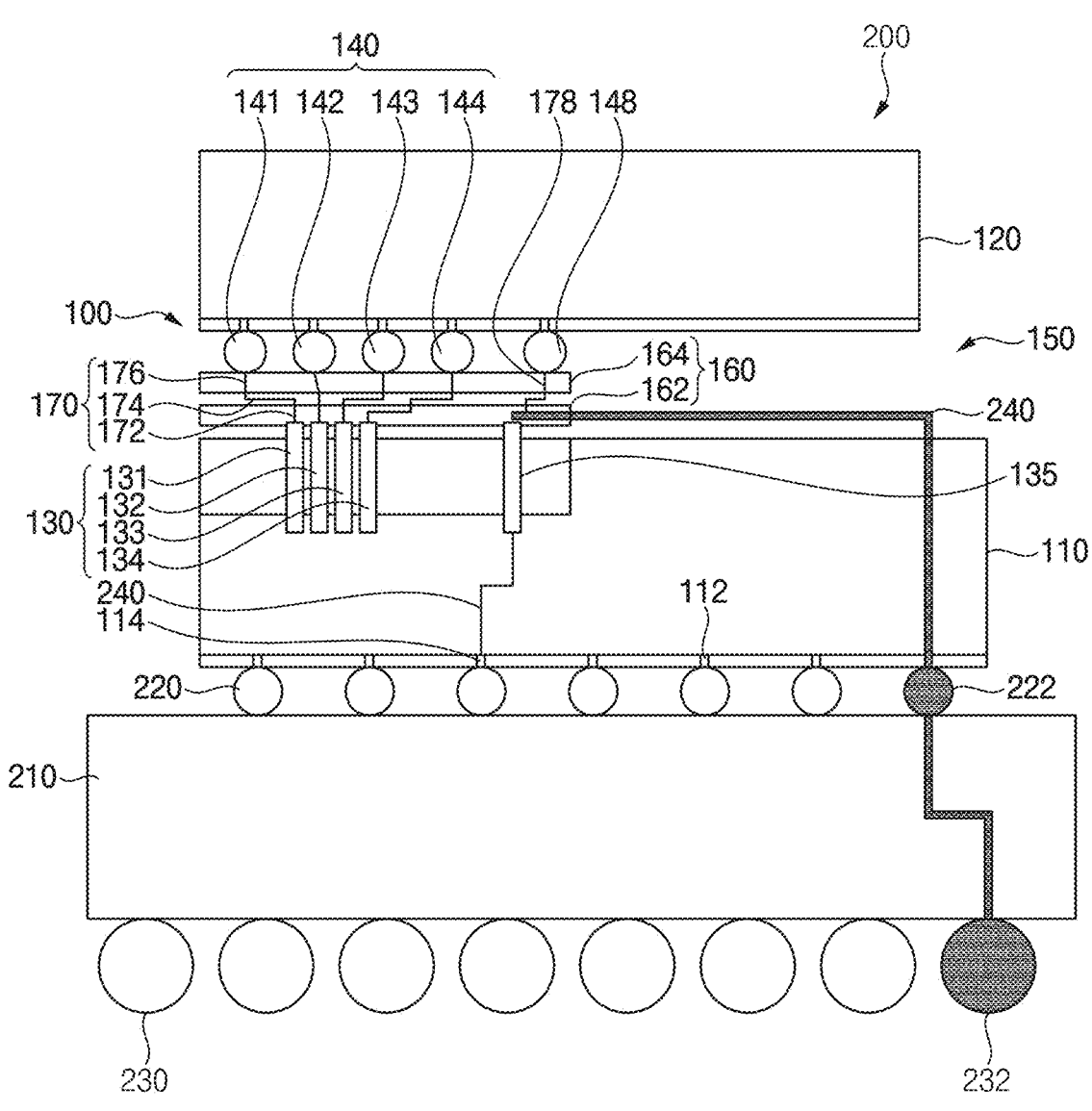

FIG. 9 is a cross-sectional view illustrating a semiconductor package including the integrated circuit device in FIG. 1.

Referring to FIG. 9, a semiconductor package 200 of this example embodiment may include a package substrate 210, an integrated circuit device 100, a plurality of conductive bumps 220 and a plurality of external terminals 230.

The package substrate 210 may include an insulation substrate, a plurality of upper pads, a plurality of lower pads and conductive lines. The upper pads may be arranged on an upper surface of the insulation substrate. The lower pads may be arranged on a lower surface of the insulation substrate. The conductive lines may be arranged in the insulation substrate to electrically connect the upper pads with the lower pads.

The integrated circuit device 100 may be arranged on or over the package substrate 210. The integrated circuit device 100 may have a structure substantially the same as the structure of the integrated circuit device 100 in FIG. 1. Thus, the same reference numerals may refer to the same elements and any further illustrations with respect to the same elements may be omitted herein for brevity.

In this example embodiment, the integrated circuit device 100 may further include a power TSV 135. The power TSV 135 may be arranged in the first semiconductor chip 110. Power may be applied to the power TSV 135. A gap between the power TSV 135 and the fourth signal TSV 134 may be wider than the second pitch P2.

The conductive bumps 220 may be interposed between the package substrate 210 and the integrated circuit device 100 to electrically connect the package substrate 210 with the integrated circuit device 100. For example, the conductive bumps 220 may electrically connect the first pads 112 of the first semiconductor chip 110 with the upper pads of the package substrate 210. One of the conductive bumps 220 may correspond to a power bump 222.

The external terminals 230 may be mounted on a lower surface of the package substrate 210. The external terminals 230 may be electrically connected to the lower pads of the package substrate 210. One of the external terminals 230 may correspond to a power external terminal 232.

In this example embodiment, the semiconductor package 200 may further include a power line 240. The power line 240 may be arranged in the first semiconductor chip 110 to electrically connect the power TSV 135 with the power external terminal 232. For example, the power line 240 may be connected to the power TSV 135 with the power external terminal 232 through the power bump 222. Further, the power line 240 may extend on the upper surface of the first semiconductor chip 110. The power line 240 may be connected to an upper end of the power TSV 135. In some example embodiments, the power line 240 passing through the power TSV 135 may be connected to a power pad 114 among the first pads 112 of the first semiconductor chip 110. In some example embodiments, the power line 240 may be connected to the power TSV 135, and the power TSV 135 is connected to a corresponding one of the conductive bumps 220 through a signal pattern that is arranged in the first semiconductor chip 110.

Figure 10:
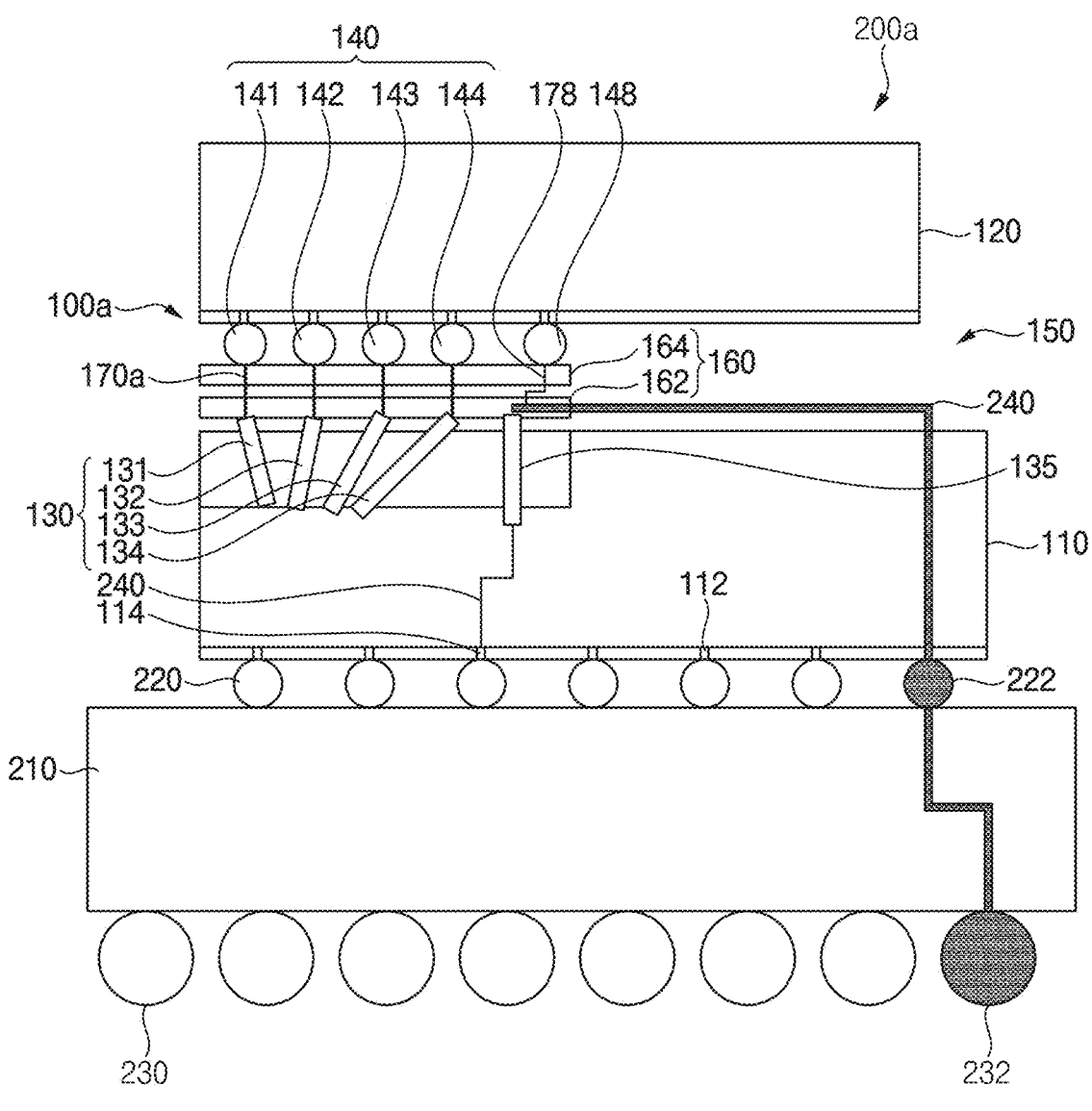

FIG. 10 is a cross-sectional view illustrating a semiconductor package including the integrated circuit device in FIG. 5.

A semiconductor package 200a of example embodiments may include elements substantially the same as those of the semiconductor package 200 in FIG. 9 except for an integrated circuit device. Thus, the same reference numerals may refer to the same elements and any further illustrations with respect to the same elements may be omitted herein for brevity.

Referring to FIG. 10, a semiconductor package 200a may include the integrated circuit device 100a in FIG. 5. Thus, any further illustrations with respect to the integrated circuit device 100a in FIG. 5 may be omitted herein for brevity.

Figure 11:
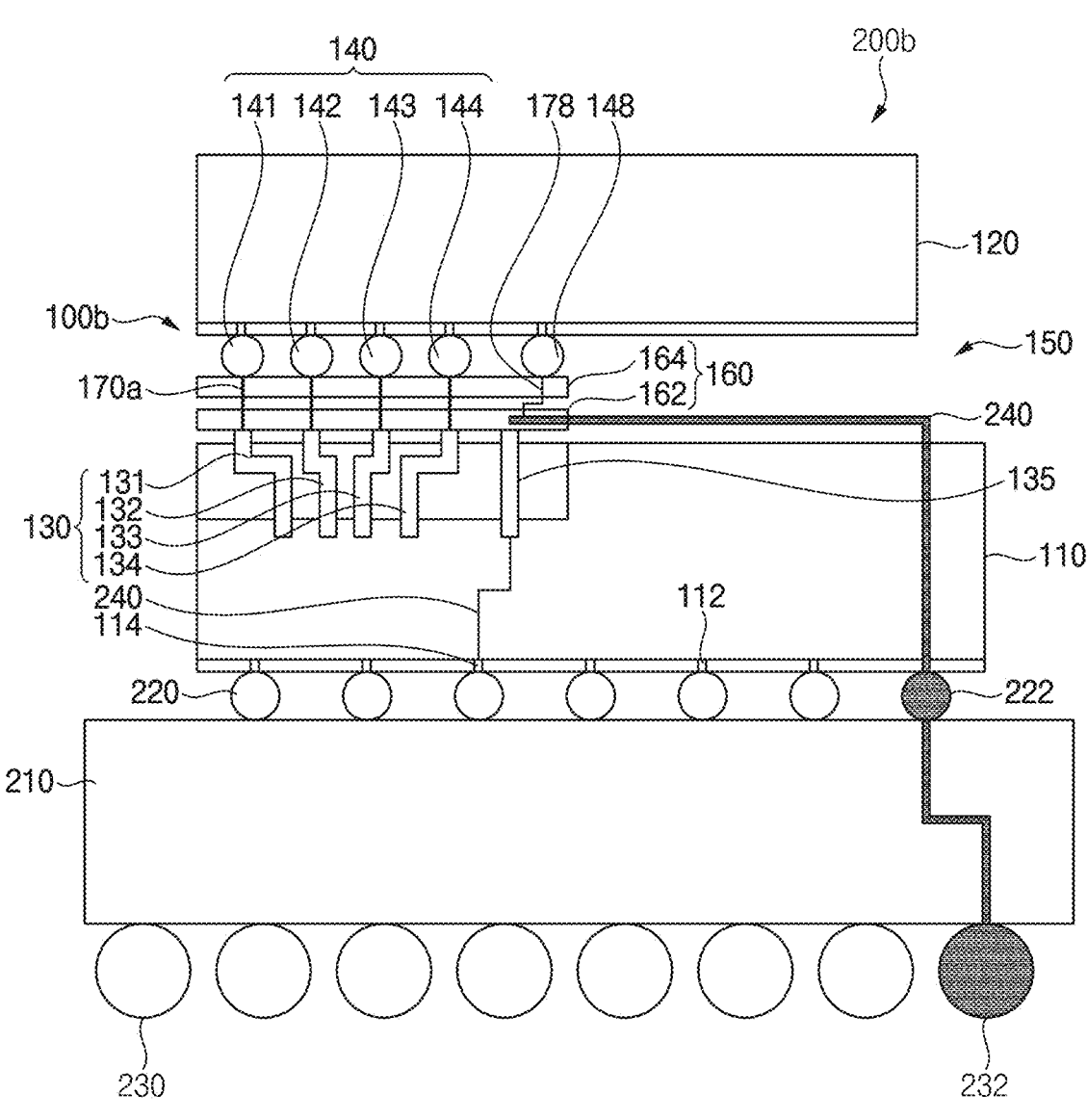

FIG. 11 is a cross-sectional view illustrating a semiconductor package including the integrated circuit device in FIG. 7.

A semiconductor package 200b of example embodiments may include elements substantially the same as those of the semiconductor package 200 in FIG. 9 except for an integrated circuit device. Thus, the same reference numerals may refer to the same elements and any further illustrations with respect to the same elements may be omitted herein for brevity.

Referring to FIG. 11, a semiconductor package 200b may include the integrated circuit device 100b in FIG. 7. Thus, any further illustrations with respect to the integrated circuit device 100b in FIG. 7 may be omitted herein for brevity.

According to example embodiments, the first pitch between the signal TSVs in the first semiconductor chip may be narrower than the second pitch between the signal bumps of the second semiconductor chip arranged on the first semiconductor chip to decrease an occupying area of the signal TSVs in the first semiconductor chip. The narrower first pitch between the signal TSVs may provide a region between the signal TSVs with a smaller area. Thus, the integrated circuit device may have a smaller size.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An integrated circuit device comprising:
   a first semiconductor chip;
   a plurality of signal TSVs in the first semiconductor chip and spaced apart from each other by a first pitch;
   a second semiconductor chip on the first semiconductor chip;
   a plurality of signal bumps on a lower surface of the second semiconductor chip and spaced apart from each other by a second pitch wider than the first pitch; and
   an interposer interposed between the first semiconductor chip and the second semiconductor chip and electrically connecting the signal TSVs with the signal bumps.

2. The integrated circuit device of claim 1, wherein the signal TSVs are parallel to each other and extends in a direction substantially perpendicular to an upper surface of the first semiconductor chip.

3. The integrated circuit device of claim 2, wherein the interposer comprises:
   at least one insulation layer; and
   a plurality of signal patterns in the insulation layer and electrically connecting the signal TSVs with the signal bumps.

4. The integrated circuit device of claim 3, wherein the insulation layer comprises:
   a first insulation layer; and
   a second insulation layer on the first insulation layer.

5. The integrated circuit device of claim 4, wherein each of the signal patterns comprises:
   a first signal line vertically extending in the first insulation layer and connected to a corresponding one of the signal TSVs;
   a second signal line horizontally extending from an upper end of the first signal line between the first insulation layer and the second insulation layer; and
   a third signal line vertically extending from an upper end of the second signal line in the second insulation layer and connected to a corresponding one of the signal bumps.

6. The integrated circuit device of claim 5, wherein a gap between the first signal line and the third signal line corresponds to the second pitch.

7. The integrated circuit device of claim 1, wherein the signal TSVs are slantly arranged in the first semiconductor chip and each of the signal TSVs has a first lower pitch and a first upper pitch wider than the first lower pitch.

8. The integrated circuit device of claim 7, wherein the first upper pitch corresponds to the second pitch.

9. The integrated circuit device of claim 1, wherein the interposer comprises:
   at least one insulation layer; and
   a plurality of signal patterns in the insulation layer and electrically connecting the signal TSVs with the signal bumps.

10. The integrated circuit device of claim 9, wherein the insulation layer comprises:
    a first insulation layer; and
    a second insulation layer on the first insulation layer.

11. The integrated circuit device of claim 10, wherein each of the signal patterns comprises:
    a first signal line vertically extending in the first insulation layer and connected to a corresponding one of the signal TSVs; and
    a third signal line vertically extending from an upper end of the first signal line in the second insulation layer and connected to a corresponding one of the signal bumps.

12. The integrated circuit device of claim 1, wherein the signal TSVs have a stepped shape.

13. The integrated circuit device of claim 1, wherein the first pitch is about 40% to about 60% of the second pitch.

14. A semiconductor package comprising:
    a package substrate;
    a first semiconductor chip on the package substrate and electrically connected with the package substrate
    a plurality of signal TSVs in the first semiconductor chip and spaced apart from each other by a first pitch;
    a second semiconductor chip on the first semiconductor chip;
    a plurality of signal bumps on a lower surface of the second semiconductor chip and spaced apart from each other by a second pitch wider than the first pitch;
    an interposer interposed between the first semiconductor chip and the second semiconductor chip and electrically connecting the signal TSVs with the signal bumps; and
    a plurality of external terminals on a lower surface of the package substrate.

15. The semiconductor package of claim 14, wherein the signal TSVs are parallel to each other and extends in a direction substantially perpendicular to an upper surface of the first semiconductor chip.

16. The semiconductor package of claim 14, further comprising:
    a plurality of conductive bumps interposed between the package substrate and the first semiconductor chip and electrically connecting the package substrate with the first semiconductor chip.

17. The semiconductor package of claim 16, further comprising:
    a power TSV in the first semiconductor chip and electrically connected to a power external terminal among the external terminals, the power external terminal configured to receive power; and
    a power line at the first semiconductor chip to electrically connect the power TSV with the power external terminal.

18. The semiconductor package of claim 17, wherein the power line connects the power TSV with the power external terminal through a corresponding one of the conductive bumps.

19. The semiconductor package of claim 18, wherein the power line extends on an upper surface of the first semiconductor chip and is connected to an upper end of the power TSV.

20. The semiconductor package of claim 14, wherein the signal TSVs are slantly arranged in the first semiconductor chip, the first pitch has a first lower pitch between lower ends of the signal TSVs and a first upper pitch between upper ends of the signal TSVs, the first upper pitch corresponds to the second pitch and the first lower pitch correspond to the first pitch.

* * * * *